United States Patent [19]

Young

[11] Patent Number: 4,760,337
[45] Date of Patent: Jul. 26, 1988

[54] NUCLEAR MAGNETIC RESONANCE METHODS AND APPARATUS

[75] Inventor: Ian R. Young, West Overton, Nr. Marlborough, United Kingdom

[73] Assignee: Picker International Ltd., Wembley, England

[21] Appl. No.: 49,560

[22] Filed: May 13, 1987

[30] Foreign Application Priority Data

May 16, 1986 [GB] United Kingdom ............... 8611963

[51] Int. Cl.⁴ .............................................. G01R 33/20
[52] U.S. Cl. ..................................... 324/309; 324/307
[58] Field of Search ............... 324/300, 307, 309, 306, 324/308, 313, 314

[56] References Cited

U.S. PATENT DOCUMENTS

| | | | |
|---|---|---|---|
| 4,284,950 | 8/1981 | Burl et al. | 324/320 |
| 4,303,077 | 12/1981 | Lewin et al. | 128/777 |
| 4,516,074 | 5/1985 | Sugimoto | 324/309 |
| 4,564,017 | 1/1986 | Glover | 128/653 |
| 4,567,893 | 2/1986 | Charles et al. | 128/653 |
| 4,581,581 | 4/1986 | Pelc | 324/309 |
| 4,604,578 | 8/1986 | Young | 324/307 |
| 4,694,253 | 9/1987 | Le Roux | 324/309 |
| 4,694,836 | 9/1987 | Baikman | 324/309 |

OTHER PUBLICATIONS

U.S. Patent Application Ser. No. 798,551, Advertisement, Radiology, vol. 158, No. 1, Jan., 1986; "Reducing MR Respiratory Motion Artifacts".

Runge, V. M. et al.; "Respiratory Gating in Magnetic Resonance Imaging at 0.5 Tesla", Radiology, May 1984, pp. 521–523.

Wood et al.; "MR Image Artifacts from Periodic Motion", Med. Phys. 12(2), Mar./Apr. 1985, pp. 143–155.

Primary Examiner—Michael J. Tokar
Attorney, Agent, or Firm—Timothy B. Gurin

[57] ABSTRACT

A method of nuclear magnetic resonance imaging wherein motion artifacts in the image are reduced by compensating for variations in the coupling between the RF transmitter and/or detector coils (9A, 9B and/or 10A, 10B) and the body (43) being imaged due to movement of the body. Compensation is suitably effected by measuring the position of the body (43) with respect to a datum immediately prior to each excitation of nuclear spins in the body and setting the amplitude of the applied RF excitation pulse B (90°) and the detector sensitivity in dependence on the measured position.

10 Claims, 2 Drawing Sheets

NUCLEAR MAGNETIC RESONANCE METHODS AND APPARATUS

This invention relates to nuclear magnetic resonance (NMR) methods and apparatus for imaging a body. In such methods and apparatus the collection of sufficient NMR data to define an image may take an appreciable time during which movement of at least part of the region of the body being imaged may occur with resultant motion artifacts in the image obtained.

It is an object of the present invention to provide an NMR method and apparatus wherein such motion artifacts are reduced.

According to the present invention in an NMR method for imaging a region of a body, motion artifacts in the image obtained are reduced by compensating for variations due to movement of said body in the coupling between said body and means for applying an RF signal to said body to excite NMR in said region and/or the coupling between said body and means for detecting NMR in said region.

In one particular method according to the invention compensation is effected by measuring immediately prior to application of an RF signal to excite NMR in said region the position relative to a datum position of part of the body subject to movement; setting the amplitude of said RF signal at a value dependent on said measured position; and setting the sensitivity of said means for detecting NMR in said region at a value dependent on said measured position.

The invention also provides apparatus for carrying out a method according to the invention.

One method and apparatus in accordance with the invention will now be described by way of example with reference to the accompanying drawings in which.

The apparatus is for the most part of conventional form, for example, as described in U.S. Pat. Nos. 4,284,948 and 4,355,282.

The basic elements of such an apparatus are as follows:

The apparatus includes a first coil system whereby a magnetic field can be applied to a body to be examined in a given direction, normally designated the Z-direction, with a gradient in any one or more of the three orthogonal directions i.e. X, Y and Z directions.

Figure 1:
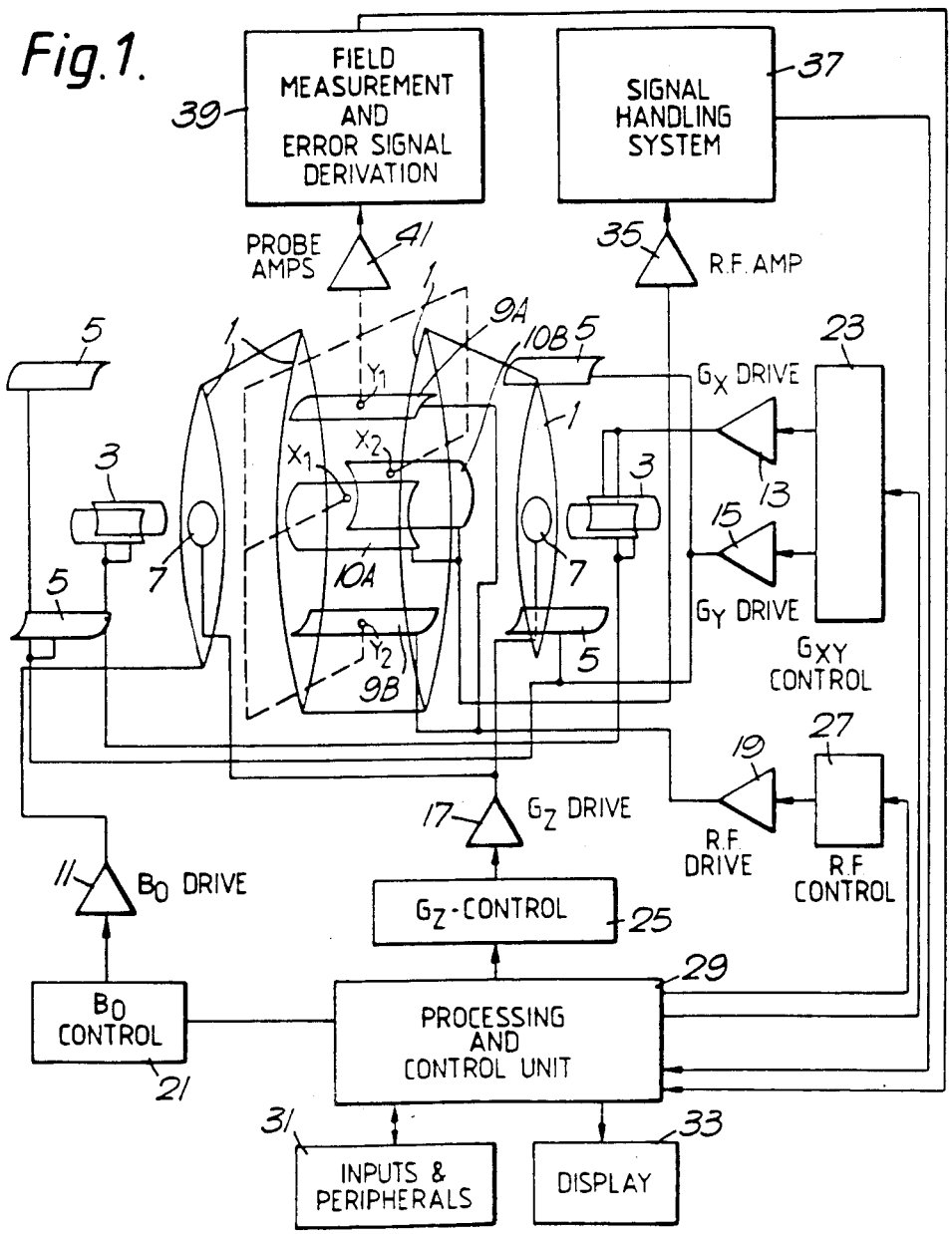
FIG. 1 and FIG. 2 illustrate the apparatus diagramatically.

Referring to FIG. 1, the first coil system comprises coils 1 which provide a steady uniform magnetic field Bo in the Z-direction; coils 3 which provide a magnetic field gradient Gx in the X-direction; coils 5 which provide a magnetic field gradient Gy in the Y-direction; and coils 7 which provide a magnetic field gradient Gz in the Z-direction.

In addition, the apparatus includes a second coil system whereby RF magnetic fields can be applied to the body under examination in a plane normal to the direction of the magnetic field produced by the first coil system, and whereby RF magnetic fields resulting from nuclei in the body under examination which have been excited to nuclear magnetic resonance with a spin vector component other than in the Z-direction can be detected.

The second coil system comprises a first coil arrangement comprising a pair of coils 9A and 9B for applying RF fields, and a second coil arrangement comprising coils 10A and 10B for detecting RF fields.

The various coils 1, 3, 5, 7 and 9A and 9B are driven by Bo, Gx, Gy, Gz and RF drive amplifiers 11, 13, 15, 17 and 19 respectively, controlled by Bo, Gxy, Gz and RF control circuits 21, 23, 25 and 27 respectively. These circuits may take various forms which are well known to those with experience of NMR equipment and other apparatus using coil induced magnetic fields.

The circuits 21, 23, 25 and 27 are controlled by a central processing and control unit 29 with which are associated inputs and other peripherals 31, for the provision of commands and instructions to the apparatus and a display 33.

The NMR signals detected by the coils 10A and 10B are applied via an amplifier 35 to a signal handling system 37. The signal handling system is arranged to make any appropriate calibration and correction of the signals, but essentially transmits the signals to the processing and control unit 29 wherein the signal are processed for application to the display to provide an image representing the distribution of an NMR quantity in the body being examined.

It will be appreciated that whilst shown separately to clarify the present description, the signal handling system 37 may conveniently form part of the unit 29.

Figure 2:
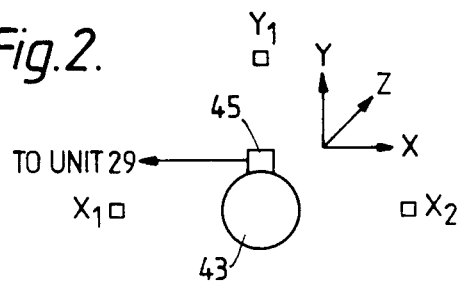

The apparatus also inclues field measurement and error signal circuits 39 which receive signals via amplifiers 41 from field probes $X_1$, $X_2$, $Y_1$ and $Y_2$ which are disposed at suitable positions in relation to the body 43 being examined, as illustrated in FIG. 2, to monitor the applied magnetic fields.

Typical methods of using the apparatus to obtain an image of a selected slice of a body under examination will now be described with reference to FIG. 3.

The body to be examined is first positioned in the apparatus so that the region of the body containing the slice to be imaged is subject to the fields produced by the first and second coil systems.

The steady magnetic field Bo is then applied in the Z-direction by means of coils 1, this field serving to define an equilibrium axis of magnetic alignment in the region of the body being examined, i.e. along the Z-direction, and remaining constant throughout the examination procedure.

A magnetic field gradient is then applied in a direction normal to the slice to be imaged by means of coils 3, 5 or 7 as appropriate. For the purposes of the present example the slice is taken to lie in the X-Y plane so that the applied gradient is in the Z-direction and is thus denoted by Gz in FIG. 3. Whilst this gradient Gz is being applied an RF magnetic field pulse denoted B(90°) is applied. The frequency of the RF pulse is chosen to be at the Larmor frequency of chosen protons, typically hydrogen protons, in the slice of the body to be imaged. Since the strength of the magnetic field and hence the Larmor frequency of the chosen protons outside the slice differs from the frequency of the applied RF pulse, proton spins within the slice only are excited by the RF pulse. The integral of the RF pulse is such that the pulse is just sufficient to tip the spins of the excited protons through 90° i.e. in the present case from the Z-direction into the X-Y plane, the spins then precessing in the X-Y plane around the Z-axis.

Immediately after the gradient Gz a gradient —Gz in the reverse direction is applied to rephase the spins in the selected slice against dephasing resulting from the gradient across the slice during excitation, as described for example in U.S. Pat. No. 4,284,948.

The above described procedure produces a free induction decay signal which may be detected by means of coils 10A and 10B. In order to obtain sufficient data to construct a two-dimensional image from the detected signals, the spins must also be encoded in known manner to enable signals arising from different parts of the slice to be distinguished from one another.

This is achieved by the application of further magnetic field gradients in the plane of the slice after excitation and before and/or during detection of the FID signal, the particular gradients used depending on the method to be employed to construct an image from the detected signals.

Figure 3:
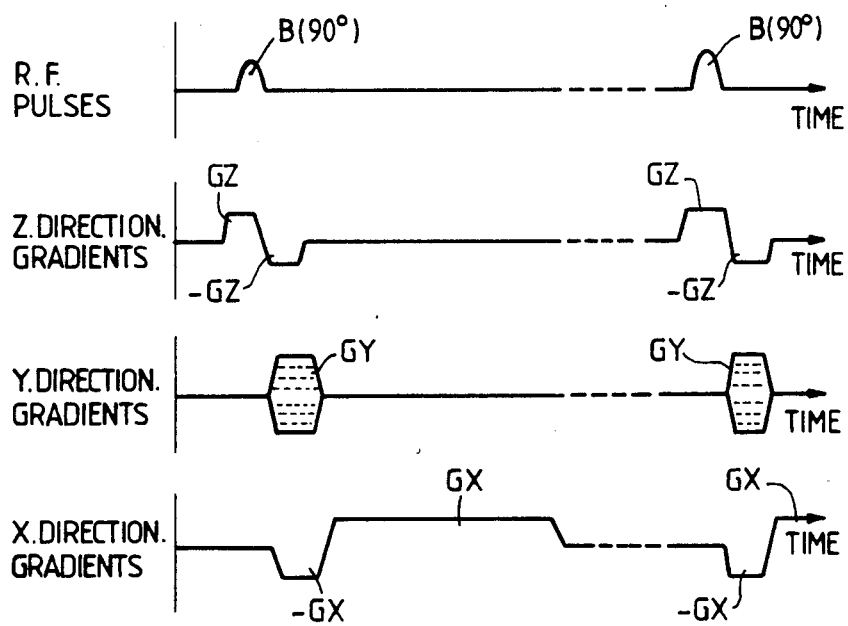
FIG. 3 illustrates a field sequence employed in the method.

For example, where a two-dimensional Fourier Transformation (2 DFT) technique is used to construct an image, the FID signal may be encoded by a phase encoding magnetic field gradient pulse Gy applied after excitation and before detection and a frequency encoding magnetic field gradient Gz applied during detection, as shown in FIG. 3. To obtain a full set of data for an image, the excitation and detection sequence is repeated a number of times with different values of the phase encoding gradient Gy. In order to avoid time shift of the FID signal by the applied frequency encoding gradient Gx, the gradient Gx is preceded by a reverse gradient $-Gx$ in known manner.

If a projection image construction technique is used a frequency encoding gradient during detection only is employed and the detection sequence repeated for different directions of the encoding gradient in the slice.

In order to reduce motion artifacts due to movement of the body under examination during data collection, movement of the body is monitored by an input peripheral 31 in the form of a motion transducer. For example, where the slice to be imaged includes the rib cage of a respiring person, a motion transducer 45 (see FIG. 2) is arranged to monitor movement of the person's chest.

The transducer 45 may be of any suitable form, for example, as described in United Kingdom patent specification GB 2,161,937 A. That particular transducer comprises a film transparency having a spatially varying optical density in a given direction. The transparency is positioned in a gap between the aligned ends of two optical fibres, the other end of one fibre being connected to a light source and the other end of the other fibre being connected to a light detector. The optical fibres are fixed with respect to the NMR apparatus whilst the transparency is mounted on the subject's chest for reciprocating motion along the said given direction as the subject breathes in and out. Hence, as the subject's chest moves, the amount of light reaching the light detector from the source varies, thus allowing movement of the subject's chest to be measured.

The transducer 45 is used to measure immediately prior to the application of each RF excitation pulse B (90°), the position of the subject's chest with respect to a datum position, for example the chest position when the subject has just breathed in.

The gains of the RF drive amplifier 19 and the RF amplifier 35 are then set by the control unit 29 in dependence on the position measured by the transducer 45. By this means it is ensured that each applied RF pulse B (90°) accurately achieves a 90° tip of the spins of the excited protons despite variation in the loading of the RF coils 9A, 9B i.e. in the coupling between the coils 9A, 9B and the body being imaged, due to movement of the subject's body. Similarly variation of the loading of the RF coils 10A, 10B, due to movements of the subject's body, is compensated by variation of the gain of the amplifier 35.

The required changes in the gains of the amplifiers 19 and 35 are conveniently assessed by investigation of the variation of the Qs of the RF coils with subject movement. The order of magnitude of such changes at different RF frequencies are indicaated in the table below, the percentage change in Q being for movement of a subject's chest between a breath held in position and a breath held out position.

| Frequency (MHz) | Change in Q (%) |
| --- | --- |
| 7.3 | 4.7 |
| 10.4 | 6.25 |
| 17.6 | 9.2 |
| 25.8 | 10.5 |

Where an excitation and data collection sequence involves more than one RF excitation pulse, position measurement and gain setting may be carried out prior to each RF pulse or before one RF pulse only e.g. the first pulse. One such sequence is the well known inversion recovery sequence where a 180° RF excitation pulse is applied prior to a sequence such as shown in FIG. 3 to enhance T1 data. It should be noted in this connection that changes in body loading will in general have a more serious effect for 180° pulses than for 90° pulses since the artifact produced by the latter will in general depend on the sine of the resulting angle of tip of the spins.

It will be appreciated that whilst a method and apparatus according to the invention will reduce motion artifacts arising due to body loading of the RF coils, other motion artifacts arise in NMR imaging which will require other techniques to reduce them. Hence a method according to the invention will normally be used in conjunction with such other techniques, for example, a technique for eliminating ghost images due to body movement such as described in U.S. patent application Ser. No. 751,186 entitled Nuclear Magnetic Resonance Method and Apparatus filed by David Robert Bailes on the 2nd July 1985.

I claim:

1. A nuclear magnetic resonance imaging method for imaging a region of a body wherein motion artifacts in the image obtained are reduced by component for variations due to movement of said body in the coupling between said body and means for applying an RF signal to said body to excite NMR in said region and/or the coupling between said body and means for detecting NMR in said region.

2. A method according to claim 1 wherein compensation is effected by measuring immediately prior to application of an RF signal to excite NMR in said region the position relative to a datum position of part of the body subject to movement; setting the amplitude of said RF signal at a value dependent on said measured position; and setting the sensitivity of said means for detecting NMR in said region at a value dependent on said measured position.

3. A nuclear magnetic resonance method for imaging a region of a body comprising the steps of: operating means for applying a radio frequency signal to excite nuclear magnetic resonance in said region; and operating means for detecting the resultant nuclear magnetic resonance in said region; and further including the step of controlling the operation of at least one of said means for applying and said means for detecting in dependence on movement of said body to compensate for variations, due to said movement, in the coupling between said body and said at least one of said means for applying and said means for detecting, thereby to reduce motion artifacts due to said movement in an image obtained.

4. A method according to claim 3 wherein said controlling step comprises: measuring the position relative to a datum position of a part of said body subject to said movement; and setting the amplitude of said RF signal in dependence on the position as measured.

5. A method according to claim 3 wherein said controlling step comprises: measuring the position relative to a datum position of a part of said body subject to said movement; and setting the sensitivity of said means for detecting in dependence on the position as measured.

6. A method according to claim 5 wherein said position is measured just prior to operation of said means for applying.

7. A method according to claim 6 wherein said controlling step further comprises setting the amplitude of said RF signal in dependence on said position as measured.

8. A nuclear magnetic resonance apparatus for imaging a region of a body comprising: excitation means arranged to excite nuclear magnetic resonance in said region; detection means arranged to detect nuclear magnetic resonance in said region; measuring means arranged to produce an output indicative of movement of a part of said body; and control means arranged to control the operation of at least one of said excitation means and said detection means in dependence on the output of said measuring means so as to compensate for variations, due to said movement, in the coupling between said body and said at least one of said excitation means and said detection means, thereby to reduce motion artifacts due to said movement in an image obtained.

9. An apparatus according to claim 8 wherein: said excitation means includes a radio frequency amplifier whose gain determines the amplitude of radio frequency pulses applied to said body to excite nuclear magnetic resonance in said region; said measuring means is arranged to produce an output representative of the position of said part of said body relative to a datum position; and said control means is arranged to control the gain of said radio frequency amplifier in dependence on said output.

10. An apparatus according to claim 8 wherein: said detection means includes a radio frequency amplifier whose gain determines the sensitivity of said detecting means; said measuring means is arranged to produce an output representative of the position of said part of said body relative to a datum position; and said control means is arranged to control the gain of said radio frequency amplifier in dependence on said output.

* * * * *